(12) United States Patent
Park

(10) Patent No.: US 8,477,547 B2
(45) Date of Patent: Jul. 2, 2013

(54) SEMICONDUCTOR MEMORY DEVICE AND METHOD OF OPERATING THE SAME

(75) Inventor: Jin Su Park, Daegu (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 172 days.

(21) Appl. No.: 13/182,917

(22) Filed: Jul. 14, 2011

(65) Prior Publication Data

US 2012/0106270 A1    May 3, 2012

(30) Foreign Application Priority Data

Oct. 27, 2010   (KR) ........................ 10-2010-0105340

(51) Int. Cl.
*G11C 29/00*      (2006.01)
(52) U.S. Cl.
USPC ..................................... 365/200; 365/189.05
(58) Field of Classification Search
USPC ................................ 365/200, 189.05, 189.02
See application file for complete search history.

(56) References Cited

U.S. PATENT DOCUMENTS

| | | | |
|---|---|---|---|
| 7,027,330 B2 | 4/2006 | Park | |
| 7,352,635 B2 | 4/2008 | Cernea | |
| 2007/0019483 A1* | 1/2007 | Lee et al. | 365/200 |
| 2008/0291739 A1* | 11/2008 | Lee et al. | 365/185.22 |

FOREIGN PATENT DOCUMENTS

| | | |
|---|---|---|
| JP | 2010-080057 | 4/2010 |
| KR | 10-1998-0063955 | 10/1998 |
| KR | 1019990050806 | 7/1999 |
| KR | 1020100075860 | 7/2012 |

OTHER PUBLICATIONS

Notice of Allowance issued by the Korean Intellectual Property Office on Sep. 26, 2012.
Office Action issued from Korean Intellectual Property Office on Feb. 22, 2012.

* cited by examiner

*Primary Examiner* — Vu Le
(74) *Attorney, Agent, or Firm* — IP & T Group LLP

(57) ABSTRACT

A semiconductor memory device includes first and second memory groups that each comprise memory cells and redundancy memory cells; first main page buffers assigned to the first memory group and second main page buffers assigned to the second memory group; first main page buffers and a first redundancy page buffer coupled between the first memory group and first internal data lines and configured to store data for the program or read operation of the memory cells and the redundancy memory cells; and a data transfer circuit configured to transfer data from a first main page buffer of the first main page buffers that corresponds to the defective column of the first memory group to the at least one second redundancy page buffer before the program operation and transfer data of the at least one second redundancy page buffer to the first main page buffer.

10 Claims, 6 Drawing Sheets

SEMICONDUCTOR MEMORY DEVICE AND METHOD OF OPERATING THE SAME

CROSS-REFERENCE TO RELATED APPLICATION

Priority to Korean patent application number 10-2010-0105340 filed on Oct. 27, 2010, the entire disclosure of which is incorporated by reference herein, is claimed.

BACKGROUND

Exemplary embodiments relate to a semiconductor memory device and, more particularly, to a semiconductor memory device performing a repair operation.

If defective memory cells are found in fabricating a semiconductor memory device, the semiconductor memory device may be treated as a bad product, and a reduction in the yield of the semiconductor memory devices may result if the entire semiconductor memory device is discarded due to the presence of few defective memory cells.

Therefore, semiconductor memory devices are further provided with a reserved unit memory cell, and a defective unit memory cell is replaced with the reserved unit memory cell so that a semiconductor memory device can be used despite having the defective unit memory cell.

If a defective column exists in a semiconductor memory device, a column repair operation may be performed in order to replace the defective column with a redundancy column.

Meanwhile, in order to increase the data input/output (I/O) speed, a wide I/O method in which memory arrays are classified into a plurality of groups by increasing the number of internal data lines may be used. According to the wide I/O method, since a redundancy column may not be used among the groups even though the same data line is shared by the groups, the repair operation may be limited in some groups when redundancy columns are not sufficient.

BRIEF SUMMARY

According to exemplary embodiments, after data is inputted or before data is outputted, an additional repair operation is performed so that a redundancy column can be shared by different groups in the wide I/O method. Accordingly, the efficiency of the repair operation may be increased.

A semiconductor memory device according to an aspect of the present disclosure includes first and second memory groups that each comprise memory cells and redundancy memory cells; first main page buffers assigned to the first memory group and second main page buffers assigned to the second memory group, wherein the first and second main page buffers are configured to each store data for a program operation or a read operation of the memory cells of the respective memory group; at least one first redundancy page buffer assigned to the first memory group and at least one second redundancy page buffer assigned to the second memory group, wherein the at least one redundancy page buffers of the first and second memory groups are each configured to store data for a defective column of the respective memory group in the at least one redundancy memory cell of the respective memory group; and a data transfer circuit configured to transfer data from a first main page buffer of the first main page buffers that corresponds to the defective column of the first memory group to the at least one second redundancy page buffer before the program operation and transfer data of the at least one second redundancy page buffer to the first main page buffer corresponding to the defective column of the first memory group after the read operation.

A method of operating a semiconductor memory device according to another aspect of the present disclosure includes inputting data to first main page buffers and at least one first redundancy page buffer that correspond to a first memory group and to second main page buffers and at least one second redundancy page buffer that correspond to a second memory group; transferring the data inputted to a first main page buffer of the first main page buffers that corresponds to a defective column of the first memory group to the second redundancy page buffer when a number of defective columns within the first memory group becomes greater than a total number of defective columns within of the first memory group that are repairable using the at least one redundancy page buffer; and performing a program operation for storing the data of the first and the second main page buffers, the at least first redundancy page buffer and the at least second redundancy page buffer in memory cells and redundancy memory cells of the first and the second memory groups.

A method of operating a semiconductor memory device according to yet another aspect of the present disclosure includes storing data, read from a first memory group, in first main page buffers and at least one first redundancy page buffer and storing data, read from a second memory group, in second main page buffers and at least one second redundancy page buffer; replacing data stored in a first main page buffer of the first main page buffers that corresponds to a defective column of the first memory group with data stored in the at least one second redundancy page buffer when a total number of defective columns within the first memory group is greater than the total number of defective columns within the first memory group that are repairable using the at least one redundancy page buffer; and outputting the data of the first main page buffers and the at least one first redundancy page buffer through first internal data lines and outputting the data of the second main page buffers and the at least one second redundancy page buffer through second internal data lines.

DESCRIPTION OF EMBODIMENTS

Hereinafter, some exemplary embodiments of the present disclosure will be described in detail with reference to the accompanying drawings. The figures are provided to enable those of ordinary skill in the art to make and use the embodiments of the disclosure.

Figure 1:
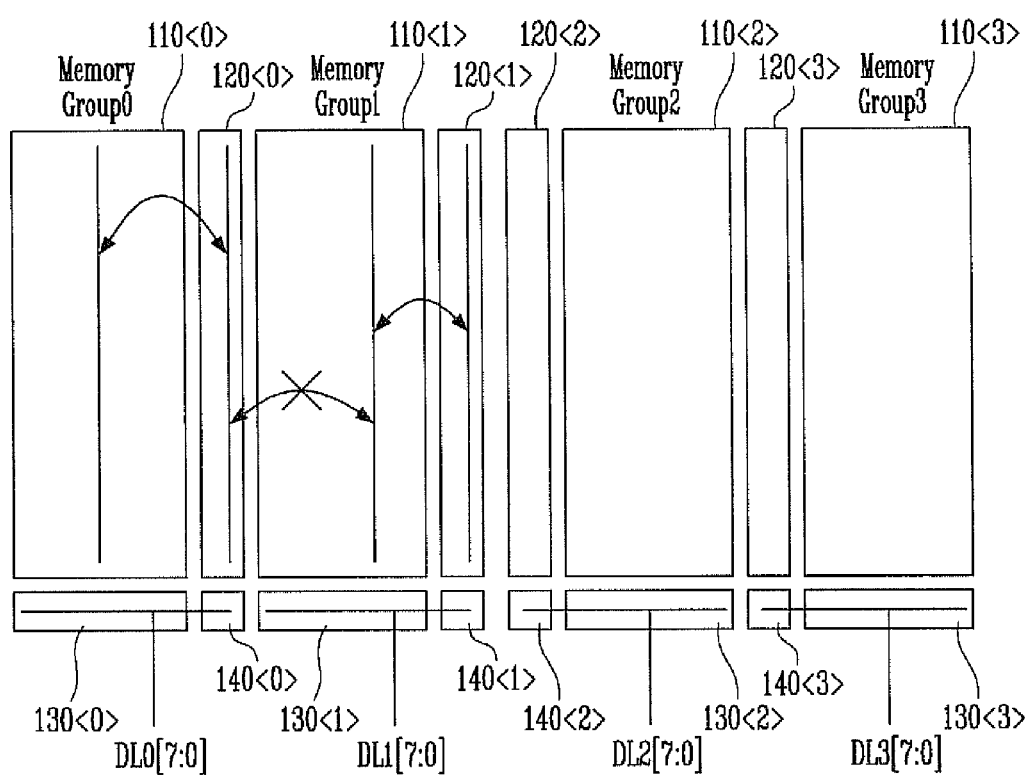
FIG. 1 is a schematic block diagram illustrating a method of operating a semiconductor memory device according to a first exemplary embodiment of this disclosure.
Figure 2A:
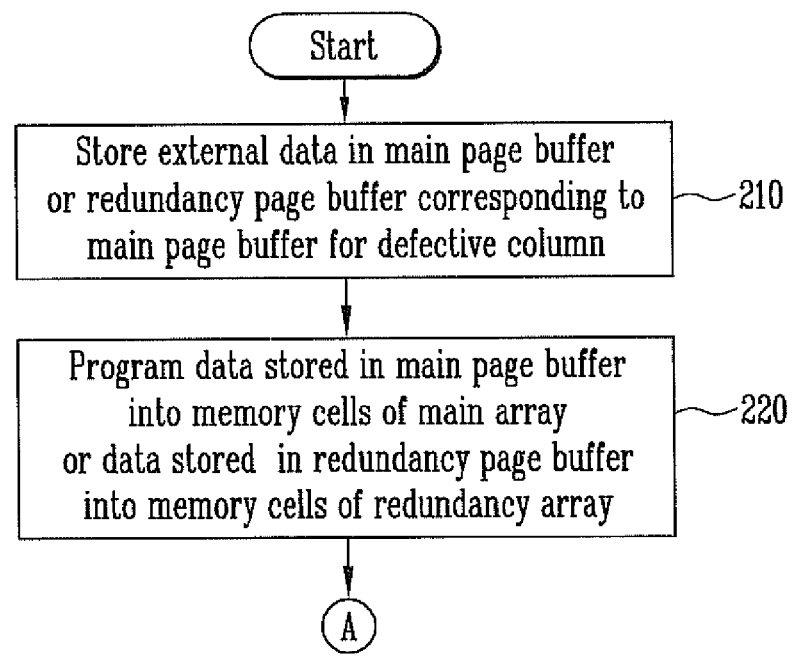
FIGS. 2A and 2B are flowcharts illustrating the method of operating the semiconductor memory device according to the first exemplary embodiment of this disclosure.
Figure 2B:
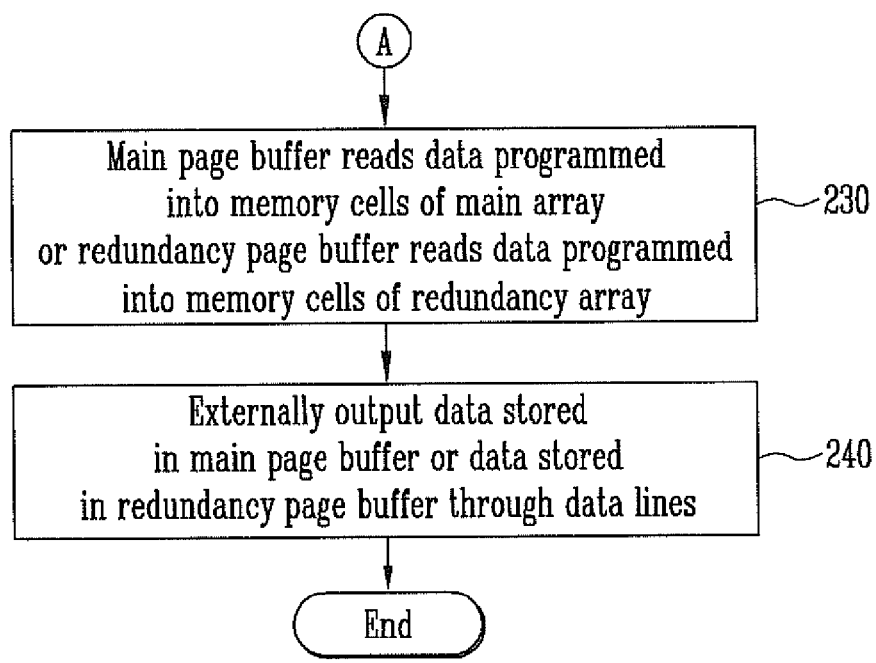

FIG. 1 is a schematic block diagram illustrating a method of operating a semiconductor memory device according to a first exemplary embodiment of this disclosure, and FIGS. 2A and 2B are flowcharts illustrating the method of operating the semiconductor memory device according to the first exemplary embodiment of this disclosure.

The semiconductor memory device according to the exemplary embodiment of this disclosure has a wide I/O structure. The wide I/O structure refers to a structure in which an N multiple of data lines DL are internally installed so that a large quantity of data can be inputted or outputted at once for a high-speed data I/O operation.

Referring to FIG. 1, in the exemplary embodiment of this disclosure, four data lines DL0 to DL3 are internally installed so that memory arrays can be classified into four groups Memory Group0 to Memory Group3.

One of the four groups is coupled to data lines DL<7:0> through which data of 8 bits can be inputted or outputted and is configured to input or output data of 1 byte at once. Accordingly, when the memory arrays and the operation circuits are divided into the four groups as in the exemplary embodiment of this disclosure, data of 4 bytes can be inputted or outputted at once so that a high-speed data I/O operation may be performed.

The first memory group Memory Group0 includes a first main array 110<0>, a first redundancy array 120<0>, a first main page buffer 130<0>, and a first redundancy page buffer 140<0>.

The second memory group Memory Group1 includes a second main array 110<1>, a second redundancy array 120<1>, a second main page buffer 130<1>, and a second redundancy page buffer 140<1>.

The third memory group Memory Group2 includes a third main array 110<2>, a third redundancy array 120<2>, a third main page buffer 130<2>, and a third redundancy page buffer 140<2>.

The fourth memory group Memory Group3 includes a fourth main array 110<3>, a fourth redundancy array 120<3>, a fourth main page buffer 130<3>, and a fourth redundancy page buffer 140<3>.

The data I/O method of the semiconductor memory device having the above configuration is described as follows.

In the method of operating the semiconductor memory device according to the first exemplary embodiment of this disclosure, the data I/O operation is performed by determining whether to perform a repair operation in real time when data is inputted or outputted.

Referring to FIG. 2A, first, when data is inputted, external data is stored in the main page buffer 130 or the redundancy page buffer 140 at step 210. That is, when an inputted address is not a defective column address, the data is stored in the main page buffer 130. When the inputted address corresponds to a defective column address, the data is not stored in the main page buffer for a defective column, but in the redundancy page buffer 140.

The data stored in the main page buffer 130 is programmed into the memory cells of the main array 110 or the data stored in the redundancy page buffer 140 is programmed into the memory cells of the redundancy array 120 at step 220.

Referring to FIG. 2B, when data is outputted, data programmed into the memory cells of the main array 110 is read by the main page buffer 130 or data programmed into the memory cells of the redundancy array 120 is read by the redundancy page buffer 140 at step 230.

The data stored in the main page buffer 130 or the data stored in the redundancy page buffer 140 is externally outputted through the data lines DL at step 240.

In this data I/O method, a repair operation is performed in real time when data is inputted or outputted. That is, in the case where the address of a defective column is inputted and a program operation is to be performed for memory cells of the defective column, the program operation is performed for the memory cells of a redundancy column corresponding to the defective column instead. Information about the above correspondence between the redundancy column and the defective column may be stored in a fuse or a CAM cell provided in a memory device when the memory device is tested.

Since the repair operation is performed in real time as described above, the determination time pertinent to the repair operation is taken when data is inputted or outputted. Therefore, the I/O speed may become slow and a repair operation between different groups may be difficult to be performed.

FIG. 1 shows the range of repair operation to be performed. That is, in the wide IO structure, a redundancy column is not shared by different groups. When a redundancy column is insufficient within one group, repair operation is not properly performed even though there are redundancy columns in the other group. It may lead to a reduction in the efficiency of repair operation.

Such repair operation between the different groups can be performed using a data line multiplexer. In the multi-I/O method, additional data lines for redundancy arrays and redundancy page buffers are installed and redundancy data lines and main data lines are selected based on repair information in order to increase the efficiency of the repair operation. In this case, since the additional redundancy data lines are installed, the chip size may be increased. The process of selecting the redundancy and main data lines takes a certain time, and the data I/O speed may become low. Furthermore, a repair operation may not be performed for different column addresses.

A method of performing a repair operation using redundancy columns of different groups is described as follows.

Figure 3A:
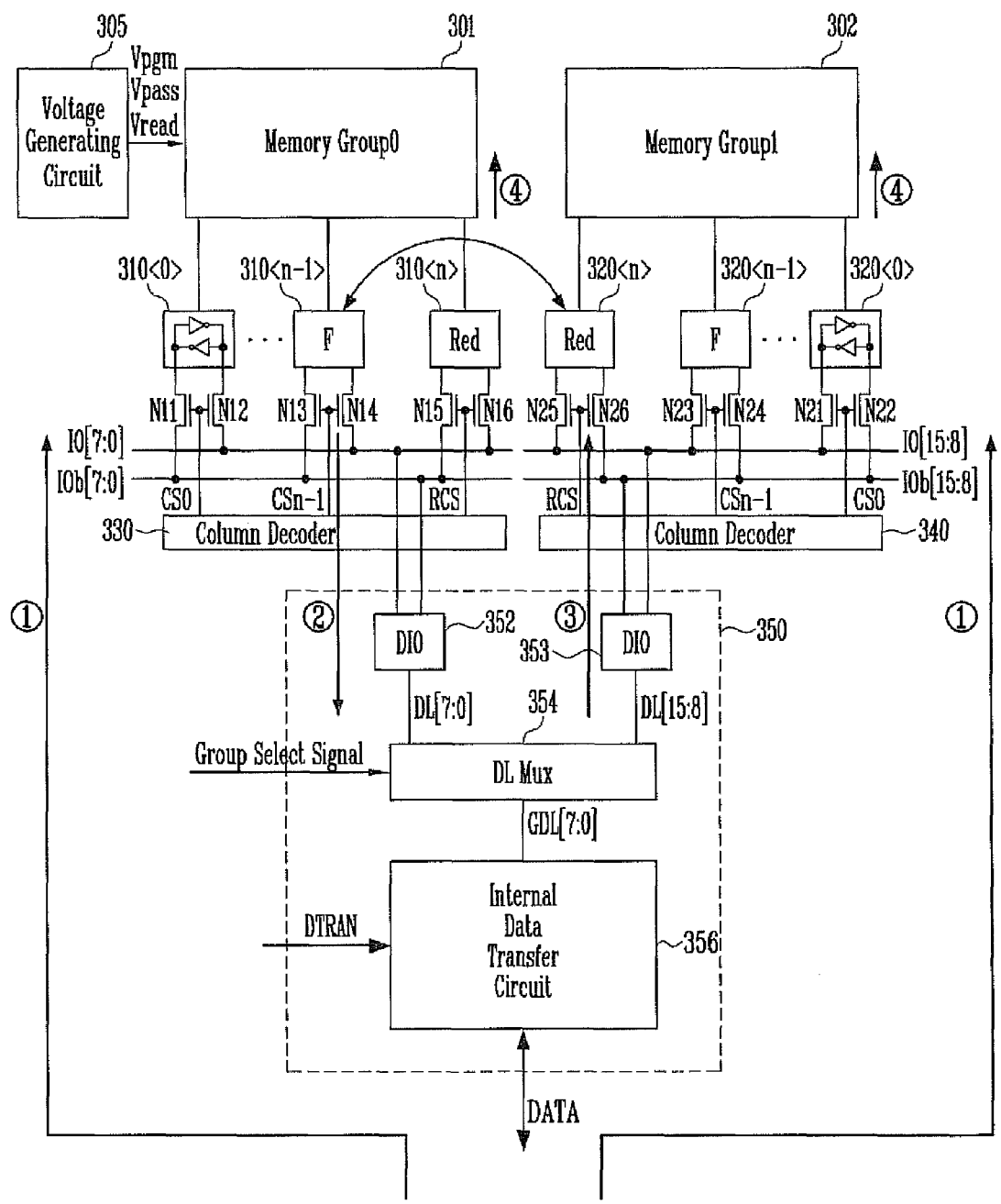
FIGS. 3A and 3B are circuit diagrams illustrating a semiconductor memory device according to a second exemplary embodiment of this disclosure.
Figure 3B:
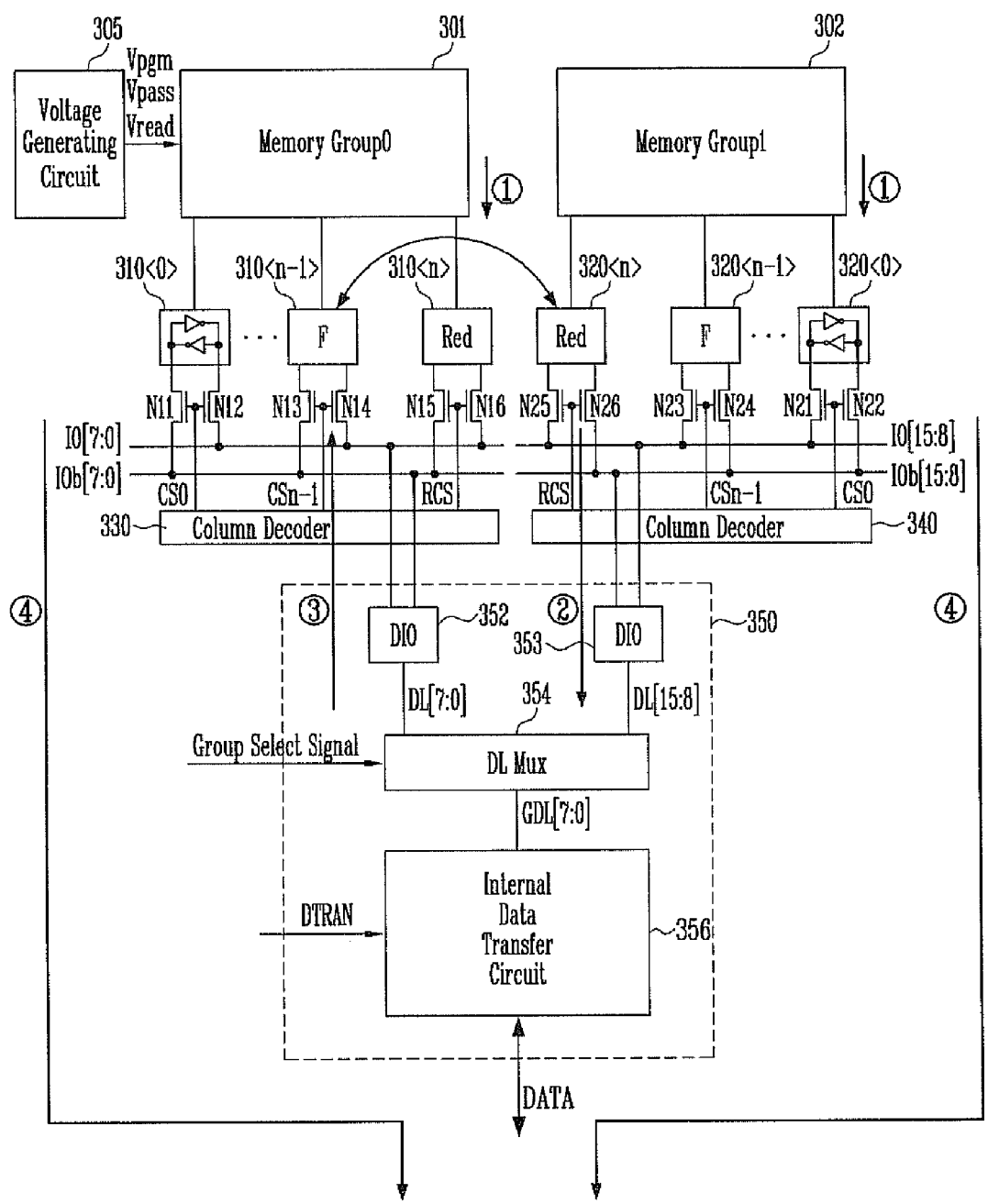
Figure 4A:
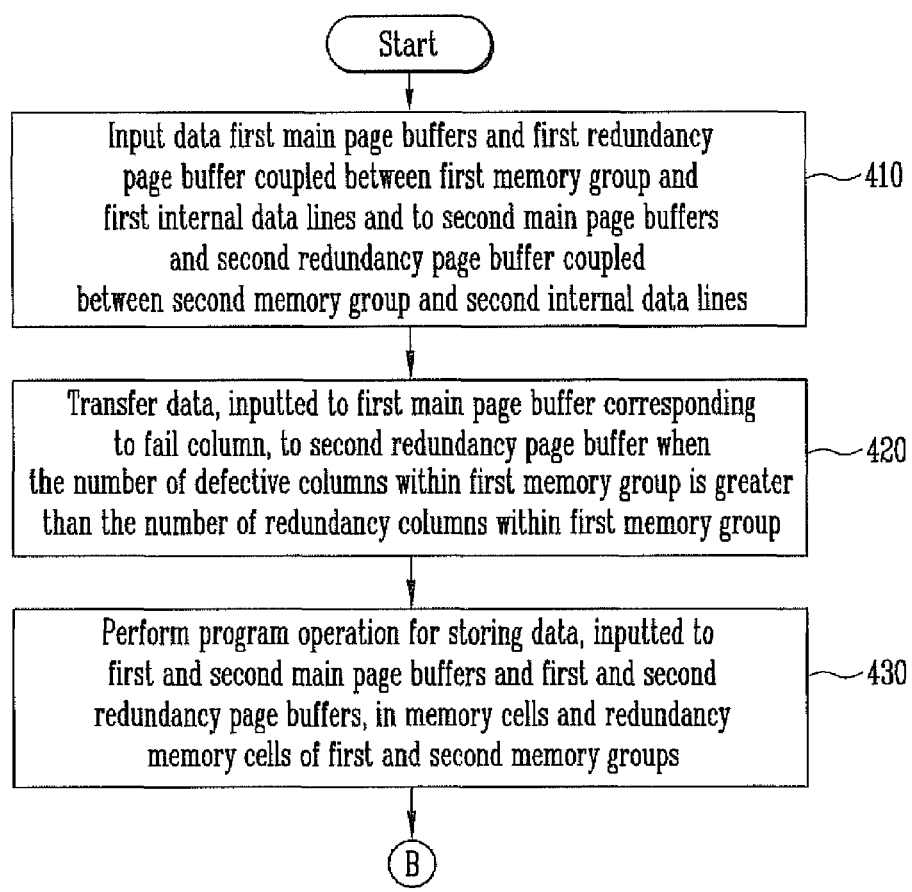
FIGS. 4A and 4B are flowcharts illustrating the method of operating the semiconductor memory device according to the second exemplary embodiment of this disclosure.
Figure 4B:
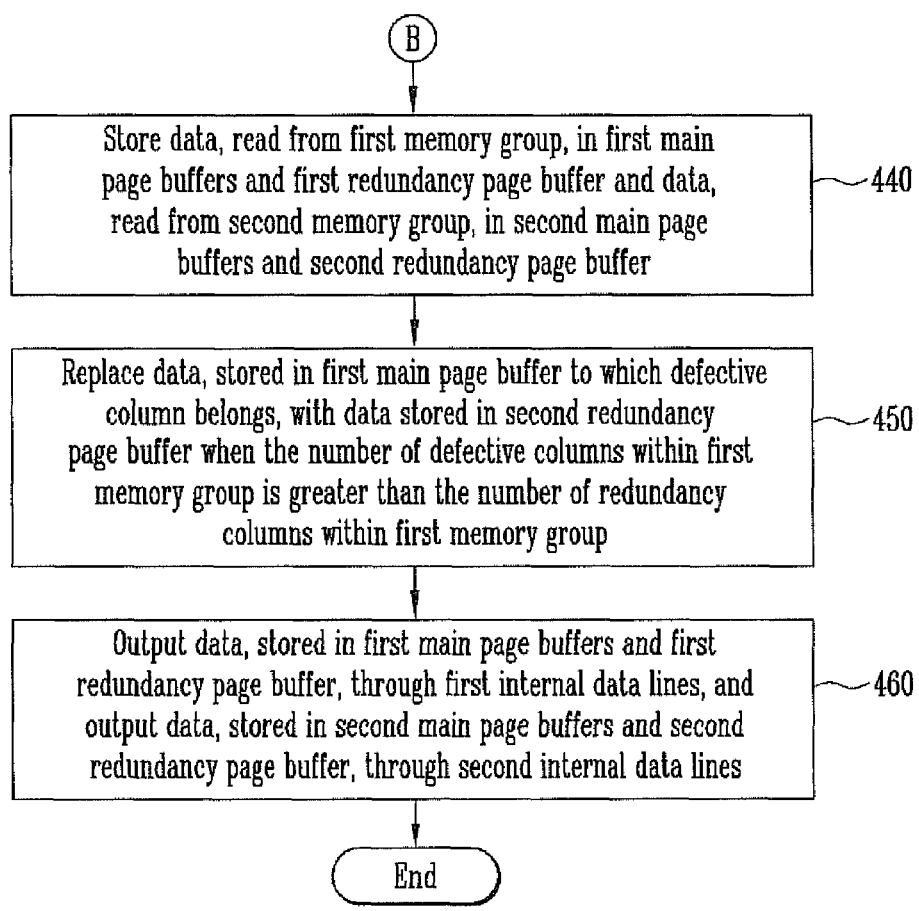

FIGS. 3A and 3B are circuit diagrams illustrating a semiconductor memory device according to a second exemplary embodiment of this disclosure, and FIGS. 4A and 4B are flowcharts illustrating the method of operating the semiconductor memory device according to the second exemplary embodiment of this disclosure.

Referring to FIGS. 3A and 3B, the semiconductor memory device according to the second exemplary embodiment of this disclosure includes memory groups (for example, a first memory group 301 and a second memory group 302), first main page buffers 310<0> to 310<n−1>, a first redundancy page buffer 310<n>, second main page buffers 320<0> to 320<n−1>, a second redundancy page buffer 320<n>, and a data transfer circuit 350. The semiconductor memory device may further include a voltage generating circuit 305 and column decoders 330 and 340.

The voltage generating circuit 305 outputs operating voltages for programming, reading, or erasing memory cells to the word lines of the first and the second memory groups 301 and 302. In particular, when memory cells are programmed or read, the voltage generating circuit 305 outputs the operating voltages (for example, Vpgm, Vpass, and Vread) for programming or reading the memory cells to the word lines of the first and the second memory groups 301 and 302.

As in the first exemplary embodiment of this disclosure, a plurality of data lines is internally installed additionally, and thus memory arrays are classified into the plurality of memory groups in the second exemplary embodiment. Hereinafter, an example in which the memory arrays and the operation circuits are classified into two groups (that is, the first memory group 301 and the second memory group 302) is described, for convenience of description.

Each of the first memory group 301 and the second memory group 302 includes memory cells and redundancy memory cells.

The first main page buffers 310<0> to 310<n−1> and the first redundancy page buffer 310<n> are coupled between the first memory group 301 and first internal data lines IO[7:0] and IOb[7:0] and are configured to store data for the program operation or the read operation of the memory cells and the redundancy memory cells.

The second main page buffers 320<0> to 320<n−1> and the second redundancy page buffer 320<n> are coupled between the second memory group 302 and second internal data lines IO[15:8] and IOb[15:8] and are configured to store data for the program operation or the read operation of the memory cells and the redundancy memory cells.

NMOS transistors are coupled between the page buffer (that is, the first main page buffers 310<0> to 310<n−1> and the first redundancy page buffer 310<n>) and the first internal data lines (that is, the data lines IO[7:0] and the inverse data lines IOb[7:0]).

More particularly, a first NMOS transistor N11 is coupled between the first main page buffer 310<0> and the inverse data lines IOb[7:0]. A second NMOS transistor N12 is coupled between the first main page buffer 310<0> and the data lines IO[7:0]. A third NMOS transistor N13 is coupled between the first main page buffer 310<n−1> and the inverse data lines IOb[7:0]. A fourth NMOS transistor N14 is coupled between the first main page buffer 310<n−1> and the data lines IO[7:0]. A fifth NMOS transistor N15 is coupled between the first redundancy page buffer 310<n> and the inverse data lines IOb[7:0]. A sixth NMOS transistor N16 is coupled between the first redundancy page buffer 310<n> and the data lines IO[7:0].

NMOS transistors are coupled between the page buffers (that is, the second main page buffers 320<0> to 320<n−1> and the second redundancy page buffer 320<n>) and the second internal data lines (that is, the data lines IO[15:8] and the inverse data lines IOb[15:8]). They have the same construction as the NMOS transistors and the first buffers and internal data lines described above, and a detailed description thereof is omitted.

The gates of the first NMOS transistor N11 and the second NMOS transistor N12, the gates of the third NMOS transistor N13 and the fourth NMOS transistor N14, and the gates of the fifth NMOS transistor N15 and the sixth NMOS transistor N16 are coupled and supplied with column selection signals CS0 to CSn−1 and RCS generated by the column decoder 330, respectively. Accordingly, when the column selection signals CS0 to CSn−1 and RCS are received, the transistors are turned on, and thus the page buffers are coupled to the data lines IO[7:0] and the inverse data lines IOb[7:0]. The reason why the data lines IO[7:0] and the inverse data lines IOb[7:0] are used is to clarify the level of data by storing the level of data and the opposite level thereof in the data lines IO[7:0] and the inverse data lines IOb[7:0] even when levels of inputted and outputted data are unclear.

The data transfer circuit 350 transfers data, stored in the first main page buffer 310<n−1> to which a defective column belongs, to the second redundancy page buffer 320<n> before a program operation or transfers data, stored in the second redundancy page buffer 320<n>, to the first main page buffer 310<n−1> to which a defective column belongs before the data is outputted after a read operation.

The data transfer circuit 350 includes a first data I/O circuit DIO 352, a second data I/O circuit DIO 353, a data line multiplexer DL Mux 354, and an internal data transfer circuit 356.

The first data I/O circuit 352 is coupled between the first internal data lines IO[7:0] and IOb[7:0] and first data lines DL[7:0]. The first data I/O circuit 352 is configured to sense data stored in the first main page buffer 310<n−1> for a defective column and transfer the sensed data to the first data lines DL[7:0] or configured to transfer data, received through the first data lines DL[7:0], to the first main page buffer 310<n−1> for a defective column.

The second data I/O circuit 353 is coupled between the second internal data lines IO[15:8] and IOb[15:8] and the second data lines DL[15:8]. The second data I/O circuit 353 is configured to transfer data, received through the second data lines DL[15:8], to the second redundancy page buffer 320<n> or configured to sense data stored in the second redundancy page buffer 320<n> and transfer the sensed data to the second data lines DL[15:8].

The data line multiplexer 354 is coupled between the first and the second data lines DL[7:0] and DL[15:8] and the global data lines GDL[7:0]. The data line multiplexer 354 is configured to transfer data, received from the first data I/O circuit 352 or the second data I/O circuit 353, to global data lines GDL[7:0] or configured to transfer data, received through the global data lines GDL[7:0], to the first data I/O circuit 352 or the second data I/O circuit 353 in response to a group select signal.

The internal data transfer circuit 356 is configured to store data received from the data line multiplexer 354 and transfer the stored data to the data line multiplexer 354 in response to a data transfer signal DTRAN, in order to transfer data, received from the first data I/O circuit 352, to the second data I/O circuit 353 and transfer data, received from the second data I/O circuit 353, to the first data I/O circuit 352.

The internal data transfer circuit 356 may include a register (not shown) for storing the data received from the data line multiplexer 354.

The group select signal or the data transfer signal DTRAN may be generated by a control circuit (not shown).

In the exemplary embodiment of this disclosure, the plural column decoders are used, for convenience of description. However, the column decoder may be in common used by the first memory group 301 and the second memory group 302.

The data I/O method of the semiconductor memory device constructed as above is described as follows.

In a method of operating the semiconductor memory device according to the second exemplary embodiment of this disclosure, a repair operation may not be performed at the same time as data input and output operations, but separately performed, e.g., after data is inputted and before data is outputted.

That is, before data is programmed into memory cells after the data is inputted to the first main page buffer, an operation of transferring the data stored in the first main page buffer for a defective column to the second redundancy page buffer is performed. Furthermore, before data programmed into memory cells is outputted after the data is read by the page buffer, an additional repair operation of transferring data, stored in the second redundancy page buffer, to the first main page buffer for a defective column is performed.

Referring to FIGS. 3A and 4A, in the wide I/O method of inputting or outputting data by increasing the number of internal data lines and grouping memory arrays into a plurality of groups sharing one data line, when data is inputted, first, data is inputted to the first main page buffers 310<0> to 310<n−1> and the first redundancy page buffer 310<n> coupled between the first memory group 301 and the first internal data lines IO[7:0] and IOb[7:0] and to the second main page buffers 320<0> to 320<n−1> and the second redundancy page buffer 320<n> coupled between the second memory group 302 and the second internal data lines IO[15:8] and IOb[15:8] (①and step 410).

Next, data inputted to the first main page buffer 310<n−1> for a defective column is transferred to the second redundancy page buffer 320<n> at step 420.

When a semiconductor memory device is tested, the number and addresses of defective columns and the number of redundancy columns can be confirmed. Accordingly, when the semiconductor memory device is tested, information about the number and addresses of the defective columns, the number of redundancy columns, and the addresses of redundancy columns corresponding to the defective columns can be stored in a fuse or a CAM cell in advance.

If the number of defective columns within the first memory group 301 is greater than the number of redundancy columns within the first memory group 301 based on the above information, a repair operation is performed using redundancy columns belonging to another group as described above. For example, a repair operation for only those columns in excess of the number of redundancy columns repairable within the first memory group 301 using redundancy page buffers of the first memory group 301 may be performed by using redundancy page buffers of the second memory group 302.

More particularly, data stored in the first main page buffer 310<n−1> for the excessive number of defective columns of the first memory group 301 is outputted to the global data lines GDL[7:0] via the first data I/O circuit 352 and the first data lines DL[7:0] in response to the column selection signal CSn−1 of the column decoder 330 (②). The outputted data is transferred to the second redundancy page buffer 320<n> of the second memory group 302 via the second data lines DL[15:8] and the second data I/O circuit 353 in response to the column selection signal RCS of the column decoder 340 (③).

Next, a program operation for storing the data, inputted to the first and the second main page buffers 310<0> to 310<n−1> and 320<0> to 320<n−1> and the first and the second redundancy page buffers 310<n> and 320<n>, in the memory cells and the redundancy memory cells of the first and the second memory groups 301 and 302 is performed (④, step 430).

If the number of defective columns within the first memory group 301 is smaller than the number of redundancy columns within the first memory group 301, data may not be inputted to the first main page buffer 310<n−1> for the defective columns but may be directly inputted to the first redundancy page buffer 310<n>, as in the method of operating the semiconductor memory device according to the first exemplary embodiment of this disclosure.

In an alternative embodiment, data may be inputted to the first main page buffer 310<n−1> for the defective columns as in the second exemplary embodiment and then be transferred to the first redundancy page buffer 310<n>.

Referring to FIGS. 3B and 4B, when data is outputted, first, data read from the first memory group 301 is stored in the first main page buffers 310<0> to 310<n−1> and the first redundancy page buffer 310<n>, and data read from the second memory group 302 is stored in the second main page buffers 320<0> to 320<n−1> and the second redundancy page buffer 320<n> (①, step 440).

Next, data stored in the first main page buffer 310<n−1> for a defective column is replaced with the data stored in the second redundancy page buffer 320<n> at step 450.

Here, the read operation includes an independent read operation irrelevant to a program operation. When the read operation is performed after the program operation according to the second exemplary embodiment of this disclosure, there may be no data stored in the first main page buffer 310<n−1> for the defective column. Accordingly, the data stored in the second redundancy page buffer 320<n> may be only transferred to the first main page buffer 310<n−1> for the defective column.

More particularly, the data stored in the second redundancy page buffer 320<n> of the second memory group 302 is outputted to the global data lines GDL[7:0] via the second data I/O circuit 353 and the second data lines DL[15:8] in response to the column selection signal RCS of the column decoder 340 (②). The outputted data is transferred to the first main page buffer 310<n−1> for the defective column of the first memory group 301 via the first data lines DL[7:0] and the first data I/O circuit 352 in response to the column selection signal CSn−1 of the column decoder 330 (③).

Next, the data stored in the first main page buffers 310<0> to 310<n−1> and the first redundancy page buffer 310<n> is outputted through the first internal data lines IO[7:0] and IOb[7:0], and the data stored in the second main page buffers 320<0> to 320<n−1> and the second redundancy page buffer 320<n> is outputted through the second internal data lines IO[15:8] and IOb[15:8] (④, step 460).

If the number of defective columns within the first memory group 301 is smaller than the number of redundancy columns within the first memory group 301, the data stored in the first main page buffer 310<n−1> for the defective columns may be replaced with the data stored in the first redundancy page buffer 310<n>.

In accordance with the method of operating the semiconductor memory device as described above according to the second exemplary embodiment of this disclosure, when data is inputted or outputted, a repair operation may not be performed at the same time. Accordingly, the data I/O speed can be increased, and a repair operation can be performed between different groups.

However, the program time and the read time may be increased owing to the repair operation.

For example, assuming that the number of redundancy columns is 100, it may take 20 μs (which is equal to 100×(100 ns+100 ns)) for transferring data of the defective column between the memory groups, where each redundancy column access for repairing a memory column takes additional 200 ns for inputting data (100 ns) and outputting data 100 ns). However, the above amount of time is not significant because each of the program time and the read time of most memory devices is several hundreds of or several tens of μs.

In another exemplary embodiment of this disclosure, the following method may be performed in order to reduce the above time.

A repair operation within the same group may be performed using the data I/O method according to the first exemplary embodiment of this disclosure, and a repair operation between different groups may be performed using the data I/O method according to the second exemplary embodiment of this disclosure. In this case, the data transfer time taken by the repair operation can be further reduced.

The exemplary embodiments of this disclosure are not implemented using only the apparatus and the method, but may be implemented using a program for realizing functions corresponding to the construction of the exemplary embodiment of this disclosure or a recording medium in which the program is stored. The implementations may be readily implemented by a person having ordinary skill in the art from the above description of the exemplary embodiments.

As described above, the exemplary embodiments of this disclosure are advantageous in that they can increase the efficiency of the repair operation and increase the data I/O speed.

That is, when data is inputted, an operation of reading data, stored in a page buffer for a defective column, and transferring the data to a relevant redundancy column is performed separately after the data is inputted. When data is outputted, an operation of reading data stored in a redundancy page buffer and transferring the data to a relevant page buffer for a defective column is performed separately before the data is outputted. Accordingly, the efficiency of the repair operation can be increased because a redundancy column can be shared by different groups in the wide I/O method.

The exemplary embodiments of this disclosure may be applied to all semiconductor memory devices performing a repair operation.

What is claimed is:

1. A semiconductor memory device, comprising:
   first and second memory groups that each comprise memory cells and redundancy memory cells;
   first main page buffers assigned to the first memory group and second main page buffers assigned to the second memory group, wherein the first and second main page buffers are configured to each store data for a program operation or a read operation of the memory cells of the respective memory group;
   at least one first redundancy page buffer assigned to the first memory group and at least one second redundancy page buffer assigned to the second memory group, wherein the at least one redundancy page buffers of the first and second memory groups are each configured to store data for a defective column of the respective memory group in the at least one redundancy memory cell of the respective memory group; and
   a data transfer circuit configured to transfer data from a first main page buffer of the first main page buffers that corresponds to the defective column of the first memory group to the at least one second redundancy page buffer before the program operation and transfer data of the at least one second redundancy page buffer to the first main page buffer corresponding to the defective column of the first memory group after the read operation.

2. The semiconductor memory device of claim 1, wherein the first main page buffer and the at least one first redundancy page buffer are coupled between the first memory group and first internal data lines, and the second main page buffer and the at least one second redundancy page buffer are coupled between the second memory group and second internal data lines.

3. The semiconductor memory device of claim 2, wherein the data transfer circuit comprises:
   a first data I/O circuit coupled between the first internal data lines and first data lines, configured to sense data of the first main page buffer corresponding to the defective column of the first memory group and transfer the sensed data to the first data lines, and configured to transfer data, received through the first data lines, to the first main page buffer corresponding to the defective column of the first memory group;
   a second data I/O circuit coupled between the second internal data lines and second data lines, configured to transfer data, received through the second data lines, to the at least one second redundancy page buffer, and configured to sense data of the at least one second redundancy page buffers and transfer the sensed data to the second data lines;
   a data line multiplexer coupled between the first and the second data lines and global data lines, configured to transfer data of the first data I/O circuit or the second data I/O circuit to the global data lines, and configured to transfer data, received through the global data lines, to the first data I/O circuit or the second data I/O circuit in response to a group select signal; and
   an internal data transfer circuit configured to store data of the data line multiplexer and transfer the stored data of the data line multiplexer to the data line multiplexer in response to a data transfer signal, wherein the data of the first data I/O circuit is transferred to the second data I/O circuit, and the data of the second data I/O circuit is transferred to the first data I/O circuit.

4. A method of operating a semiconductor memory device, comprising:
   inputting data to first main page buffers and at least one first redundancy page buffer that correspond to a first memory group and to second main page buffers and at least one second redundancy page buffer that correspond to a second memory group;
   transferring the data inputted to a first main page buffer of the first main page buffers that corresponds to a defective column of the first memory group to the second redundancy page buffer when a number of defective columns within the first memory group becomes greater than a total number of defective columns within of the first memory group that are repairable using the at least one redundancy page buffer; and
   performing a program operation for storing the data of the first and the second main page buffers, the at least first redundancy page buffer and the at least second redundancy page buffer in memory cells and redundancy memory cells of the first and the second memory groups.

5. The method of claim 4, wherein in the inputting of the data to the at least one first redundancy page buffer, the data to be inputted to a first main page buffer of the first main page buffers that corresponds to the defective column of the first memory group is inputted to the at least one first redundancy page buffer when a total number of defective columns within the first memory group is smaller than the total number of defective columns within the first memory group that are repairable using the at least one redundancy page buffer.

6. The method of claim 4, wherein, after the inputting of the data, further comprising transferring the data inputted to the first main page buffer corresponding to the defective column of the first memory group to the at least one first redundancy page buffer when a total number of defective columns within the first memory group is smaller than the total number of defective columns within the first memory group that are repairable using the at least one redundancy page buffer.

7. The method of claim 6, wherein the transferring of the data inputted to the first main page buffer corresponding to the defective column of the first memory group to the at least one second redundancy page buffer comprises:
   outputting the data inputted to the first page buffer corresponding to the defective column of the first memory group to global data lines; and
   transferring the data outputted to the global data lines to the at least one second redundancy page buffer.

8. A method of operating a semiconductor memory device, comprising:
   storing data, read from a first memory group, in first main page buffers and at least one first redundancy page buffer and storing data, read from a second memory group, in second main page buffers and at least one second redundancy page buffer;
   replacing data stored in a first main page buffer of the first main page buffers that corresponds to a defective column of the first memory group with data stored in the at least one second redundancy page buffer when a total number of defective columns within the first memory group is greater than the total number of defective columns within the first memory group that are repairable using the at least one redundancy page buffer; and outputting the data of the first main page buffers and the at least one first redundancy page buffer through first internal data lines and outputting the data of the second main page buffers and the at least one second redundancy page buffer through second internal data lines.

9. The method of claim 8, further comprising replacing data stored in the first main page buffer corresponding to the defective column of the first memory group with data stored in the at least one first redundancy page buffer when the total number of defective columns within the first memory group is smaller than the total number of defective columns within the first memory group that are repairable using the at least one redundancy page buffer.

10. The method of claim 8, wherein the replacing of data stored in the first main page buffer corresponding to the defective column of the first memory group with the data stored in the at least one second redundancy page buffer comprises:

outputting the data stored in the at least one second redundancy page buffer to global data lines; and transferring the data outputted to the global data lines to the first main page buffer corresponding to the defective column of the first memory group.

* * * * *